(12) United States Patent
Mori et al.

(10) Patent No.: US 12,385,851 B2
(45) Date of Patent: Aug. 12, 2025

(54) MANAGEMENT SYSTEM, MANAGEMENT DEVICE, MANAGEMENT METHOD, AND PROGRAM

(71) Applicant: OMRON Corporation, Kyoto (JP)

(72) Inventors: Hiroyuki Mori, Kyoto (JP); Keita Saji, Kyoto (JP); Mayuko Tanaka, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 174 days.

(21) Appl. No.: 18/258,457

(22) PCT Filed: Mar. 8, 2021

(86) PCT No.: PCT/JP2021/009046
§ 371 (c)(1),
(2) Date: Jun. 20, 2023

(87) PCT Pub. No.: WO2022/149293
PCT Pub. Date: Jul. 14, 2022

(65) Prior Publication Data
US 2024/0027364 A1 Jan. 25, 2024

(30) Foreign Application Priority Data
Jan. 6, 2021 (JP) .................... 2021-001113

(51) Int. Cl.
*G01N 21/95* (2006.01)
(52) U.S. Cl.
CPC ................. *G01N 21/9501* (2013.01)
(58) Field of Classification Search
CPC .......... G01N 21/9501; G05B 19/41875; G05B 2219/32187; G05B 2219/45026;
(Continued)

(56) References Cited

U.S. PATENT DOCUMENTS

2016/0321594 A1* 11/2016 Linde .................... G06F 11/008
2020/0192339 A1   6/2020 Higuchi et al.
2022/0142027 A1   5/2022 Suzuki

FOREIGN PATENT DOCUMENTS

JP    2005156156 A    6/2005
JP       3772906 B1    5/2006
(Continued)

OTHER PUBLICATIONS

International Search Report issued in Intl. Appln. No. PCT/JP2021/009046 mailed May 25, 2021. English translation provided.
(Continued)

*Primary Examiner* — Tri T Ton
(74) *Attorney, Agent, or Firm* — ROSSI, KIMMS & McDOWELL LLP

(57) ABSTRACT

A management system for a manufacturing facility including a manufacturing device including one or more device members for manufacturing a product, and an inspection device, the system including a display unit, a device member information acquisition unit, a product member information acquisition unit, a manufacturing abnormality information acquisition unit, an improvement candidate information acquisition unit configured to acquire improvement candidate information about candidates for improvement in the manufacturing facility, and a management work support unit configured to create list information and to cause the display unit to display the list information, the list information including an aggregated value of abnormalities of each sort during manufacturing the product and an aggregated value of abnormalities of each sort during inspecting the product within a predetermined aggregation time period, for each device member and/or product member as the candidate for improvement.

10 Claims, 9 Drawing Sheets

(58) Field of Classification Search
CPC .............. G06Q 10/06395; G06Q 50/04; H05K 13/0409; H05K 13/083; Y02P 90/02; A63B 2071/0063; A63B 2071/0694; A63B 2220/24; A63B 2220/53; A63B 69/3655; A63B 69/3688; A63B 71/0622; G05D 1/0255; G06F 3/16; G06F 3/167; G06V 40/16; G10L 15/22; H04R 3/00; H04R 3/005

See application file for complete search history.

(56) References Cited

FOREIGN PATENT DOCUMENTS

| | | |
|---|---|---|
| JP | 2006332461 A | 12/2006 |
| JP | 2011159699 A | 8/2011 |
| JP | 5767754 B2 | 8/2015 |
| JP | 2017194921 A | 10/2017 |
| JP | 2019096232 A | 6/2019 |
| WO | 2015115432 A1 | 8/2015 |
| WO | 2019013225 A1 | 1/2019 |
| WO | 2020188774 A1 | 9/2020 |

OTHER PUBLICATIONS

Written Opinion issued in Intl. Appln. No. PCT/JP2021/009046 mailed May 25, 2021. English translation provided.

* cited by examiner

Fig. 3

Device ID

| Number | Type | ID | Line name | Machine name | Mounter name | Image of component | Overlooking | Actual defect | Image error | Component non-suction |
|---|---|---|---|---|---|---|---|---|---|---|
| 1 | Feeder ID | FEEDER1001 | Line-1 | VT-S530-0061 | MOUNTER1-6 | | 0 | 3 | | 0 |
| 2 | Feeder ID | FEEDER2072 | Line-2 | | MOUNTER2-5 | | 0 | 0 | | 10 |
| 3 | Feeder ID | FEEDER5861 | Line-2 | | MOUNTER1-4 | | 0 | 0 | | 6 |
| 4 | Feeder ID | FEEDER0354 | Line-2 | | MOUNTER3-3 | | 0 | 0 | | 5 |
| 5 | Feeder ID | FEEDER1250 | Line-1 | | MOUNTER2-6 | | 0 | 0 | 5 | 0 |

Component Number

| Number | Type | ID | Line name | Machine name | Mounter name | Image of component | Overlooking | Actual defect | Image error | Component non-suction |
|---|---|---|---|---|---|---|---|---|---|---|
| 1 | Component Number | COMP500234 | Line-2 | VT-S530-0061 | MOUNTER3-6 | | 0 | 3 | 0 | 0 |
| 2 | Component Number | COMP121200 | Line-1 | | MOUNTER3-5 | | 0 | 0 | 0 | 5 |
| 3 | Component Number | COMP469934 | Line-1 | VT-S500-1729 | | 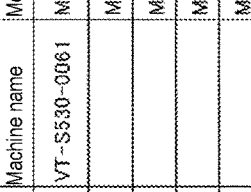 | 133 | 0 | 0 | 0 |
| 4 | Component Number | COMP220003 | Line-2 | VT-S730H-0068 | | 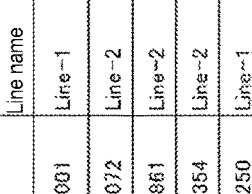 | 7 | 0 | 0 | 0 |
| 5 | Component Number | COMP980010 | Line-2 | VT-S730H-0068 | | 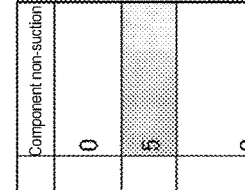 | 4 | 0 | 0 | 0 |

Fig. 7

| Board ID | Component number | Nozzle ID | Feeder ID | Number of image processing errors | Number of component non-suction errors | ... |
|---|---|---|---|---|---|---|
| B001 | P01 | NZ0001 | FD0001 | ... | ... | ... |
| B001 | P02 | NZ0003 | FD0003 | ... | ... | ... |
| B001 | P03 | NZ0004 | FD0005 | ... | ... | ... |
| ... | ... | ... | ... | ... | ... | ... |
| B002 | P01 | NZ0001 | FD0002 | ... | ... | ... |
| B002 | P02 | NZ0003 | FD0003 | ... | ... | ... |
| ... | ... | ... | ... | ... | ... | ... |

Fig. 8

Warning list (6 cases in total, 2 cases having been subjected to works)  Time and date of latest update: 2020-09-01-09:01:34
Start: 2020-08-31
End: 2020-09-01

| Status | Device Type | Device ID | Line | Image of actual defect | Number of errors | | | Time and date of latest detection |
|---|---|---|---|---|---|---|---|---|
| | | | | | Actual defect | Image processing error | Suction error | Sign of defect | |
| Detailed screen display | Nozzle | NOZZLE200340 | Line-2 | 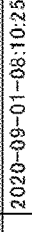 | 8 | 3 | 0 | 0 | 2020-09-01-08:10:24 |
| Detailed screen display | Feeder | FEEDER100100 | Line-2 | 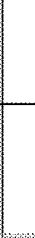 | 7 | 0 | 2 | 0 | 2020-09-01-08:10:25 |
| Detailed screen display | Component Number | COMP500234 | Line-2 |  | 6 | 1 | 2 | 3 | 2020-09-01-08:10:26 |
| Detailed screen display | Nozzle | NOZZLE830045 | Line-2 |  | 3 | 1 | 0 | 0 | 2020-09-01-08:10:27 |
| Detailed screen display | Component Number | COMP121200 | Line-2 |  | 3 | 0 | 0 | 0 | 2020-09-01-08:10:28 |
| Detailed screen display | Feeder | FEEDER200730 | Line-2 | | 0 | 0 | 23 | 1 | |

Fig. 9A

| # | Cause of occurrence of actual defect | Image processing error | Component non-suction error |
|---|---|---|---|
| 1 | The nozzle moves slowly in the upward and downward directions, and the nozzle sucks and mounts the component at unsuitable heights, which induces suction mistakes or component deviations at the time of mounting | Absence | Presence |
| 2 | The nozzle is not suitable for the component shape and is prevented from stably sucking the component, which has induced component deviations during movement of the head after the suction of the component | Absence | Absence |
| 3 | The nozzle is clogged and can not stably suck the component due to shortage of the vacuum pressure, which has induced component deviations during movement of the head after the suction of the component | Absence | Absence |

Fig. 9B

| # | Cause of occurrence of image processing error | Actual defect | Component non-suction |
|---|---|---|---|
| 1 | The actual size of the component has changed depending on lot properties | Absence | Absence |
| 2 | The position of the component has been inaccurately detected | Presence | Absence |
| 3 | The allowable range (tolerance) for the component size is too severe | Absence | Absence |
| 4 | The position at which the component is sucked has been greatly deviated | Presence | Presence |

MANAGEMENT SYSTEM, MANAGEMENT DEVICE, MANAGEMENT METHOD, AND PROGRAM

TECHNICAL FIELD

The present invention relates to techniques for quality control and process improvement for production lines.

BACKGROUND ART

Among lines for producing products which have been advanced in automation and labor saving, there have been some lines which are provided with inspection devices for intermediate processes or final processes in the lines, in order to automate detection of defects, sorting of defective products, and the like. Further, attempts have been made to estimate the causes of defects from results of inspections by such inspection devices and to utilize the estimated causes for quality control and maintenance of manufacturing facilities.

To give a conventional example relating to a line for surface mounting for printed circuit boards, as an example, Patent Document 1 discloses an idea of aggregating the defect rates regarding respective nozzles in a chip mounter (which will be also simply referred to as a mounter, hereinafter), in final inspection after reflowing, in order to present information about the nozzles which have deteriorated the quality level. Further, Patent Document 2 suggests a method which calculates defect rates of components in inspection after reflowing, regarding respective nozzles and respective feeders in a mounter, and which detects abnormalities of the nozzles and the feeders based on whether the defect rates have exceeded a defect rate in a normal state.

PRIOR ART DOCUMENTS

Patent Documents

Patent Document 1: Japanese Unexamined Patent Publication No. 2005-156156
Patent Document 2: Japanese Unexamined Patent Publication No. 2006-332461
Patent Document 3: Japanese Patent No. 5767754
Patent Document 4: Japanese Unexamined Patent Publication No. 2017-194921

SUMMARY OF THE INVENTION

Problems to be Solved by the Invention

By presenting information about defect rates regarding respective members (which are referred to as device members) included in a manufacturing device, and the like, as in the aforementioned conventional example, this information may serve as a clue for estimating the positions of malfunctions. However, this information reveals only the fact that there were many defects in the products processed by these device members. Therefore, it is impossible to confirm whether these defects were directly caused by these device members in actual. For example, in the case of a mounter, there is a possibility that such defects were caused by device members other than the nozzles and the feeders, and, also, there is a possibility that such defects were caused by other processes such as a solder printing process and a reflowing process. Furthermore, there may be a case where such defects were not caused by the manufacturing device nor by the device members and were caused by components. Further, there may be a case where such defects were caused by the combination of a specific component and a specific device member.

Further, even if a certain device member can be identified as the cause of a defect, it is impossible to identify what kind of abnormality has occurred in the device member, with the conventional method. Therefore, even if the position of a malfunction can be found, there is necessarily a need for knowledges and experiences of an expert, or there is a need for trial-and-error adjustment works, in order to identify an abnormality having actually occurred and to perform an appropriate treatment for cancelling the abnormality. For example, in the case of a mounter, even if it can be found that defects have frequently occurred regarding a certain nozzle, it is impossible to determine whether the nozzle needs replacement, whether the nozzle needs only cleaning or adjustment of the attachment thereof, whether the mounting program for the mounter should be modified for coping therewith, and whether treatments should be performed for components and device members other than the nozzle. In particular, when plural sorts of errors have occurred at the position of a malfunction, it is difficult to analyze the causes of defects and to determine countermeasures therefor.

The present invention was made in view of the aforementioned circumstances, and aims at providing a technique for improving the efficiency of maintenance and quality control of a product manufacturing facility.

Means for Solving the Problem

In order to achieve the aforementioned aim, the present invention adopts the following structure. That is, a management system for a manufacturing facility including a manufacturing device including one or more device members for manufacturing a product, and an inspection device configured to inspect the product, the system including:
  a display unit;
  a device member information acquisition unit configured to acquire device member information about each device member in the manufacturing device;
  a product member information acquisition unit configured to acquire product member information about each product member constituting the product;
  a manufacturing abnormality information acquisition unit configured to acquire manufacturing abnormality information about an abnormality during manufacturing of the product in the manufacturing device;
  an inspection information acquisition unit configured to acquire inspection information including information about an abnormality during inspection of the product by the inspection device;
  an improvement candidate information acquisition unit configured to acquire improvement candidate information which is information about the device member and/or the product member as a candidate for improvement in the manufacturing facility; and
  a management work support unit configured to create list information based on the device member information, the product member information, the manufacturing abnormality information, the inspection information, and the improvement candidate information, and configured to cause the display unit to display the list information, the list information including an aggregated value of abnormalities of each sort during manufacturing the product and an aggregated value of abnormalities of each sort during inspecting the product within a predetermined aggregation time period, for each device member and/or product component as the candidate for improvement.

Here, the term "manufacturing facility" refers to all facilities for manufacturing products, and includes, for example, a manufacturing factory, a manufacturing line, a manufacturing device, or the like. Further, the term "manufacturing device" refers to various devices for manufacturing products, and includes, for example, respective devices such as a solder printing machine, a mounter, and a reflow furnace in a line for producing printed circuit boards, devices for manufacturing various product members constituting printed circuit boards, and devices for manufacturing solders. Further, the term "device member" refers to various members and mechanisms constituting the manufacturing device, and includes, for example, nozzles, a head, feeders, cameras, a pump, a stage, and the like in a mounter. Further, the term "product member" refers to each element constituting the product, and includes, for example, an electronic product member such as an IC chip, a printed wiring board (so-called raw board), solder, and the like in a printed circuit board. Further, the term "inspection device" refers to a device for performing inspection such as automatic optical inspection (AOI) or automatic X-ray inspection (AXI), for example, and may also be an inspection device for reflecting information about visual inspection. Further, the inspection device may be incorporated in the manufacturing device.

Further, the term "device member information" includes, for example, a type of a device member, a model of the device member, a device member ID, an operating time of the device member, the number of times an operation of the device member has been performed, mounting parameters, and the like. Here, for example, in the case of a mounter, the mounting parameters may include the position of a feeder, the height at which a nozzle sucks, the moving speed of a head, and the like.

The term "product member information" includes, for example, a component number, a reel ID, a manufacturing lot of the product member, a type of the product member, a shape of the product member, a position of the product member on a board, and the like.

Further, the term "an abnormality during manufacturing of the product" refers to an error or the like detected during manufacturing the product in the manufacturing device, and includes non-suction of a component to a nozzle, an abnormality of the position/angle at which a component is sucked, and a defect of a component itself supplied from a feeder, in the case of a mounter.

Further, the term "an abnormality during inspection of the product" may include not only "an actual defect" of when the inspection device has determined that a defect has occurred and, also, a visual inspection has resulted in a determination that a defect has occurred, but also includes so-called "overlooking" (over-detection) of when the inspection device has determined that a defect has occurred but a visual inspection has resulted in a determination that the product is not defective. In addition, the term "an abnormality during inspection of the product" may also include an abnormality to be regarded as a sign of defects, such as a decrease of a quality indicator calculated from a measurement value measured during inspection, such as a process capability index, for example.

Further, the term "each product member constituting the product" as used herein does not mean each one of the components used in one product, but means, for example, each group of product members which can be specified under conditions such as product members of the same type disposed at a predetermined position of a predetermined product.

Further, the term "the device member and/or the product member as a candidate for improvement" refers to a device member and/or a product member estimated to be a cause of an abnormality, when the abnormality has occurred during manufacturing or inspecting the product. Incidentally, the term "acquiring" improvement candidate information also includes performing calculation. For example, the term "acquiring" described herein also corresponds to extracting a candidate for improvement, based on the comparison of the number of times an abnormality has occurred regarding each member with a normal value, the comparison in number of times an abnormality has occurred among different members of the same type, or the like.

With this structure, a manager of the manufacturing facility can confirm, from the list, the aggregated values of abnormalities of the respective sorts during manufacturing the product and the aggregated values of abnormalities of the respective sorts during inspecting the product, for each device member and product member as a candidate for improvement. Therefore, even when a plurality of abnormalities have occurred, the manager can efficiently narrow down the cause of the abnormalities and can take measures for improvement. Specifically, it is possible to easily narrow down the cause of abnormalities and measures to be taken therefor, in consideration of the combination of the sorts of the abnormalities. Further, it is possible to easily determine the priorities as to which member measures should be earlier taken for, based on the situation of abnormalities having occurred at the same time.

Further, the list information may further include information indicating the position at which an abnormality has occurred. Incidentally, the term "information indicating the position at which an abnormality has occurred" corresponds to a line name, a device name, an inspection machine name, an ID corresponding thereto, or the like regarding which the abnormality has occurred. With this structure, it is possible to identify the cause of the abnormality more accurately and easily.

Further, the list information may further include information about replacement of the device member, and information about maintenance of the device member. Further, the term "information about replacement of the device member" may include the date and time of latest replacement of the corresponding device member, the elapsed time period since the latest replacement thereof, the history of the number of times of replacement thereof, and the like. Further, the term "information about maintenance of the device member" may also include information such as the date and time of latest maintenance of the corresponding device member, the cumulative number of times maintenance thereof has been performed, and the like. With this structure, it is possible to narrow down the cause of abnormalities more efficiently.

Further, the management work support unit may be adapted to display the device members and/or the product members as the candidates for improvement, in descending order of number of abnormalities during manufacturing the product and/or abnormalities during inspection of the product, or in descending order of possibility of causing abnormalities during manufacturing the product and/or abnormalities during inspection of the product.

Here, descending order of number of abnormalities may be either descending order of simple total value of the numbers of respective abnormalities, or descending order of calculated total value of the numbers of abnormalities of respective sorts having been multiplied by coefficients predetermined for the respective sorts of abnormalities. Further, the term "descending order of possibility of causing abnormalities" may be descending order of score of abnormality having occurred therewith, and scores may be preliminarily defined for respective types of abnormalities. This structure clarifies the priorities, which enables performing works for improving the manufacturing facility more efficiently.

Further, the management work support unit may display, in different colors, the respective sorts of abnormalities during manufacturing the product and abnormalities during inspecting the product, in such a manner as to change a density of the colors according to numerical values of the aggregated values of the abnormalities. This structure improves the visibility of the displayed contents, which enables more efficiently narrowing down the cause of abnormalities.

Further, the candidate for improvement in the improvement candidate information may be constituted by only the device member and/or the product member regarding which a cause of an abnormality during manufacturing the product and/or an abnormality during inspection of the product has been identified.

For example, if the cause of an abnormality can be identified under a predetermined rule, based on the combination of the type of the abnormality and the position at which the abnormality has occurred, it is efficient to display only the device member or the product member which has induced this cause. This allows the manager of the facility to take only measures for improvement for coping with the cause (an instruction therefor), which can significantly shorten the time required for correcting the abnormality since the occurrence of the abnormality.

Further, the product is a component mounted board, the manufacturing device is a chip mounter, and the product member is the component, abnormalities during manufacturing the product include at least one of a component non-suction defect during mounting the component, and a defect of image determination processing during mounting the component, and abnormalities during inspecting the product include at least one of an actual defect of the component mounted board, over detection, and an abnormality of a measurement value.

Here, the term "a defect of image determination processing during mounting the component" refers to a deviation of the state of the component being sucked by a nozzle (the position/angle at which the component being sucked) from a predetermined allowable range, a defect of the component itself supplied from a feeder (a difference of the component, missing of a terminal, etc.), and the like. This structure is preferable, since chip mounters in production lines for component mounted boards include many device members which may cause abnormalities.

Further, according to the present invention, there is provided a management device for a manufacturing facility including a manufacturing device including one or more device members for manufacturing a product, and an inspection device configured to inspect the product, the device including:

a device member information acquisition unit configured to acquire device member information about each device member in the manufacturing device;

a product member information acquisition unit configured to acquire product member information about each product member constituting the product;

a manufacturing abnormality information acquisition unit configured to acquire manufacturing abnormality information about an abnormality during manufacturing of the product in the manufacturing device;

an inspection information acquisition unit configured to acquire inspection information including information about an abnormality during inspection of the product by the inspection device;

an improvement candidate information acquisition unit configured to acquire improvement candidate information which is information about the device member and/or the product member as a candidate for improvement in the manufacturing facility; and a management work support unit configured to create list information including an aggregated value of abnormalities of each sort during manufacturing the product and an aggregated value of abnormalities of each sort during inspecting the product within a predetermined aggregation time period, for each device member and/or product member as the candidate for improvement, based on the device member information, the product member information, the manufacturing abnormality information, the inspection information, and the improvement candidate information.

Further, in order to attain the aforementioned aim, according to the present invention, there is provided a method for managing a manufacturing facility including a manufacturing device including one or more device members for manufacturing a product, and an inspection device configured to inspect the product, the method including:

a device member information acquisition step of acquiring device member information about each device member in the manufacturing device;

a product member information acquisition step of acquiring product member information about each product member constituting the product;

a manufacturing abnormality information acquisition step of acquiring manufacturing abnormality information about an abnormality during manufacturing of the product in the manufacturing device;

an inspection information acquisition step of acquiring inspection information including information about an abnormality during inspection of the product by the inspection device;

an improvement candidate information acquisition step of acquiring improvement candidate information which is information about the device member and/or the product member as a candidate for improvement in the manufacturing facility;

a management work support information creation step of creating list information including an aggregated value of abnormalities of each sort during manufacturing the product and an aggregated value of abnormalities of each sort during inspecting the product, within a predetermined aggregation time period, for each device member and/or product member as the candidate for the improvement, based on the device member information, the product member information, the manufacturing abnormality information, the inspection information, and the improvement candidate information; and a management work support information output step of outputting the list information created in the management work support information creation step.

Further, the present invention can be also implemented as a program configured to cause a computer to execute the aforementioned method, and a computer-readable recording medium configured to record such a program non-temporarily. Further, the aforementioned respective structures and processes can be combined with each other to constitute the present invention, provided that no technical contradictions arise.

Effect of the Invention

According to the present invention, it is possible to provide a technique for improving the efficiency of maintenance and quality control of a product manufacturing facility.

BRIEF DESCRIPTION OF THE DRAWINGS

FIG. 3 is a view illustrating an example of a management work support screen displayed in the manufacturing facility management system according to the example of application.

FIG. 7 is a view illustrating an example of manufacturing log data.

FIG. 8 is a view illustrating an example of a management work support screen displayed in a display device according to the embodiment.

FIG. 9A is a first view relating to a method for narrowing down the cause of an abnormality in a device to be improved, by a management device according to the embodiment.

FIG. 9B is a second view relating to the method for narrowing down the cause of an abnormality in a device to be improved, by the management device according to the embodiment.

MODE FOR CARRYING OUT THE INVENTION

Hereinafter, examples of the present invention will be described, with reference to the drawings. Incidentally, constituent components which will be described in the respective examples are not intended to limit the scope of the invention only thereto, in terms of dimension, material, shape, relative arrangement, etc., unless otherwise specified.

Examples of Applications

Figure 1:
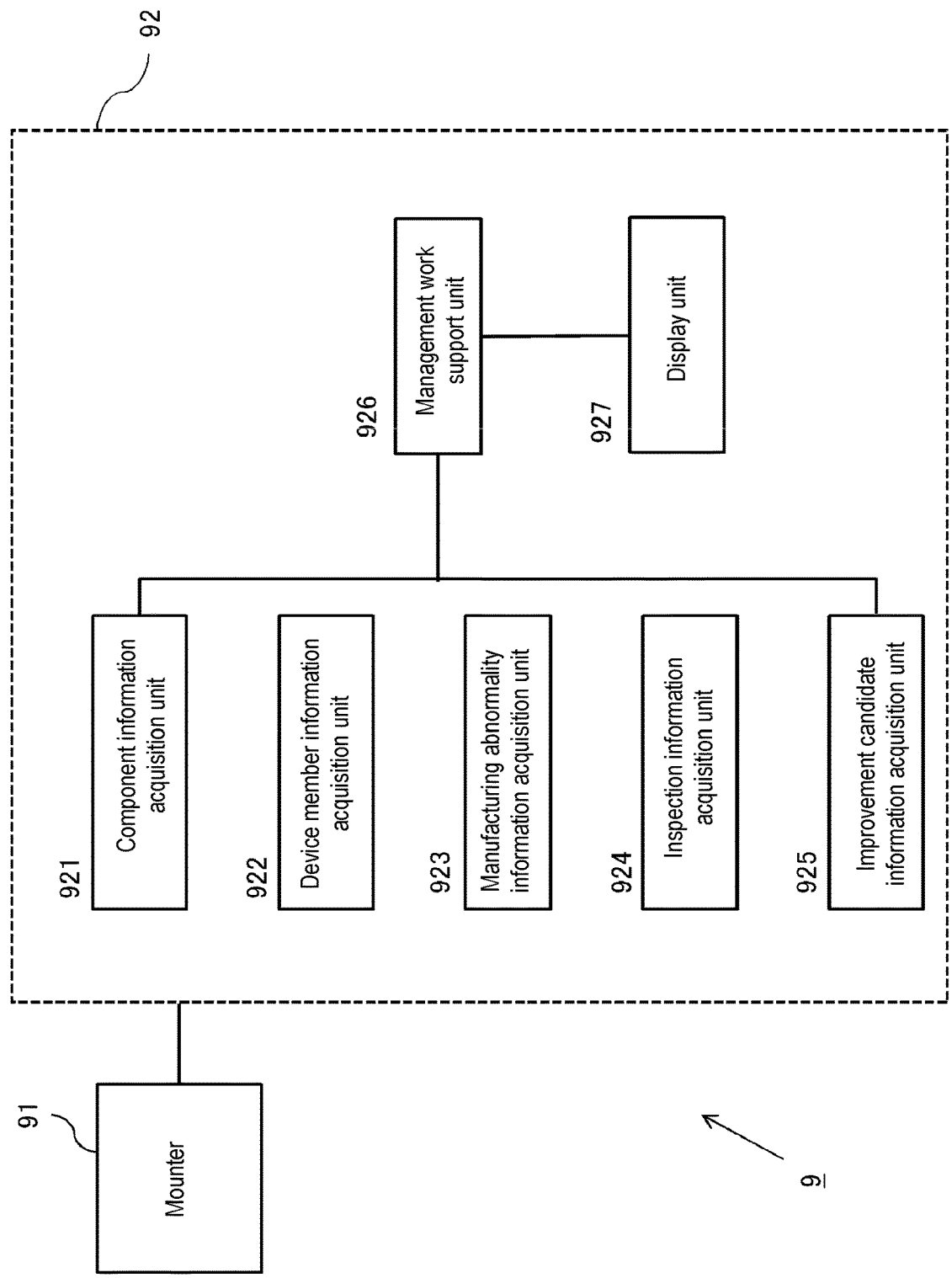
FIG. 1 is a schematic diagram of the structure of a manufacturing facility management system according to an example of application.

The present invention can be applied to, for example, a manufacturing facility management system 9 as illustrated in FIG. 1. The manufacturing facility management system 9 is a system for managing a chip mounter in a surface mounting line for printed circuit boards. The manufacturing facility management system 9 includes a mounter 91 and an inspection device 92 as constituent components.

The mounter 91 is a device for picking up an electronic component to be mounted on a board and placing the electronic component on a solder paste at a corresponding position.

The inspection device 92 is a device for inspecting the state of placement of electronic components with respect to the board carried out from the mounter 91. The inspection device 92 measures, in a two-dimensional or three-dimensional manner, the state of placement of components (which may be portions of components such as component bodies or electrodes) placed on the solder paste. Further, from the result of the measurement, the inspection device 92 determines whether or not these components have normal values (within allowable ranges), in terms of various inspection items.

As illustrated in FIG. 1, the manufacturing facility management system 9 includes a component information acquisition unit 921, a device member information acquisition unit 922, a manufacturing abnormality information acquisition unit 923, an inspection information acquisition unit 924, an improvement candidate information acquisition unit 925, a management work support unit 926, and a display unit 927, and their functions are implemented in the inspection device 92.

The component information acquisition unit 921 acquires information about components, such as various electronic components used in the mounter 91, boards, and solders. The device member information acquisition unit 922 acquires information about various members and mechanisms which constitute the mounter.

The manufacturing abnormality information acquisition unit 923 acquires information about errors detected when the mounter 91 mounts components on a board. Specifically, the manufacturing abnormality information acquisition unit 923 acquires an image of a component being sucked by a nozzle, through a camera (not illustrated) disposed in the mounter 91. Further, the manufacturing abnormality information acquisition unit 923 processes this image, in order to determine the presence or absence of an abnormality. Incidentally, information about this error is associated with the device member and the component with which the abnormality has occurred.

The inspection information acquisition unit 924 acquires information about the result of inspection by the inspection device 92. Particularly, when an abnormality has occurred, the inspection information acquisition unit 924 acquires information about the abnormality. Here, the term "when an abnormality has occurred" includes when "an actual defect" has occurred, which is when the inspection device 92 has determined that a defect has occurred and, also, a visual inspection has resulted in a determination that a defect has occurred. Furthermore, the term "when an abnormality has occurred" also includes when so-called "overlooking" has occurred, which is when the inspection device 92 has determined that a defect has occurred but a visual inspection has resulted in a determination that the product is not defective. Incidentally, information about this abnormality is associated with the device member and the component with which the abnormality has occurred.

When an abnormality has occurred during manufacturing or inspection, the improvement candidate information acquisition unit 925 acquires information about a constituent component of the mounter 91 or a component number which is estimated to be a cause of the abnormality (namely, which is considered to need some improvement).

The management work support unit 926 creates list information including the aggregated values of abnormalities of respective sorts during manufacturing, and the aggregated values of abnormalities of respective sorts during inspections, within a predetermined aggregation time period, for the respective device members and components as the candidates for improvement, based on the information acquired by the component information acquisition unit 921, the device member information acquisition unit 922, the manufacturing abnormality information acquisition unit 923, the inspection information acquisition unit 924, and the improvement candidate information acquisition unit 925. Further, the management work support unit 926 outputs this list information to the display unit 927.

Figure 2:
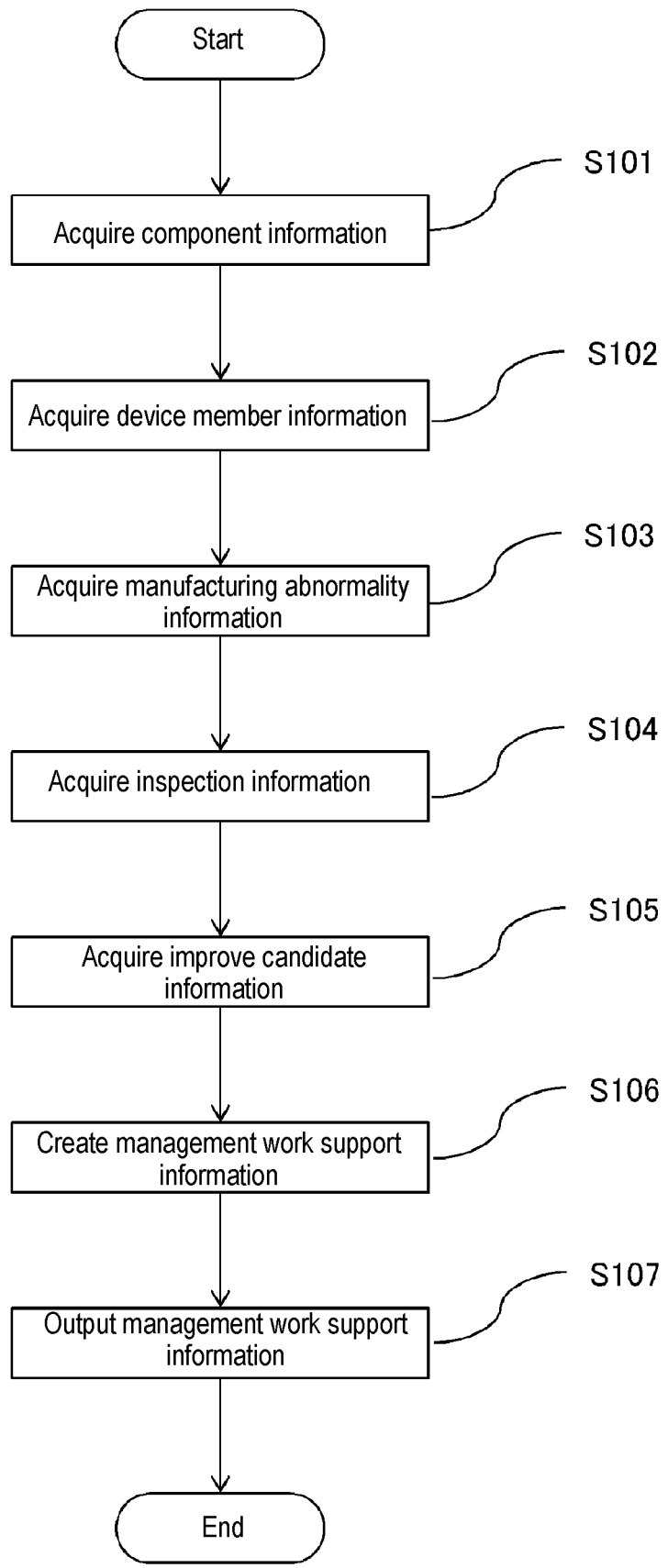
FIG. 2 is a flowchart illustrating a flow of processes in the manufacturing facility management system according to the example of application.

Next, with reference to FIG. 2, there will be described the flow of processes for displaying a management work support screen in the manufacturing facility management system 9. First, the component information acquisition unit 921 acquires component information (S101), and the device member information acquisition unit 922 acquires device-member information (S102). Further, the manufacturing abnormality information acquisition unit 923 acquires manufacturing abnormality information (S103), and the inspection information acquisition unit 924 acquires inspection information (S104). Further, the improvement candidate information acquisition unit 925 acquires information about device structures and components which are estimated to be causes of abnormalities (S105). Next, the management work support unit 926 creates list information including the aggregated values of abnormalities of respective sorts during manufacturing and abnormalities of respective sorts during inspection, within a predetermined aggregation time period, for the respective device members and components as the candidates for improvement, based on the information acquired in the steps S101 to S105 (S106). Then, the display unit 927 is caused to display the information created by the management work support unit 926 in the step S106 (step S107), and the series of processes is ended.

FIG. 3 illustrates an example of a management work support screen displayed on the display unit 927. As illustrated in FIG. 3, in list information created by the management work support unit 926, there are displayed, in a lateral row, the aggregated values of abnormalities of respective sorts during inspection and the aggregated values of abnormalities of respective sorts during manufacturing components, regarding members (five feeders) in mounters and components (five product numbers) which have been extracted as candidates for improvement. Specifically, there are displayed the respective aggregated values of occurrences of "overlooking" and "actual defects" as sorts of abnormalities during inspection, and the respective aggregated values of occurrences of "image processing errors" and "component non-suction errors" as sorts of abnormalities during manufacturing.

In addition to the aggregated values of abnormalities of the respective sorts, in the list information, there are displayed information indicating the positions at which the abnormalities have occurred (line names, mounter names, and inspection machine names), and information about IDs of the device members. Further, the fields of the respective aggregated values of abnormalities are displayed in colors corresponding to the sorts of the abnormalities. When the numerical values of the aggregated values are larger, these colors are displayed densely (no color is displayed for an aggregated value of 0).

The manager of the manufacturing facility can efficiently narrow down the causes of occurrences of abnormalities, by checking the screen as described above (which will be also referred to as a management work support screen).

Embodiment

Hereinafter, there will be described, in more detail, an example of a mode for carrying out the present invention.

(System Structure)

Figure 4:
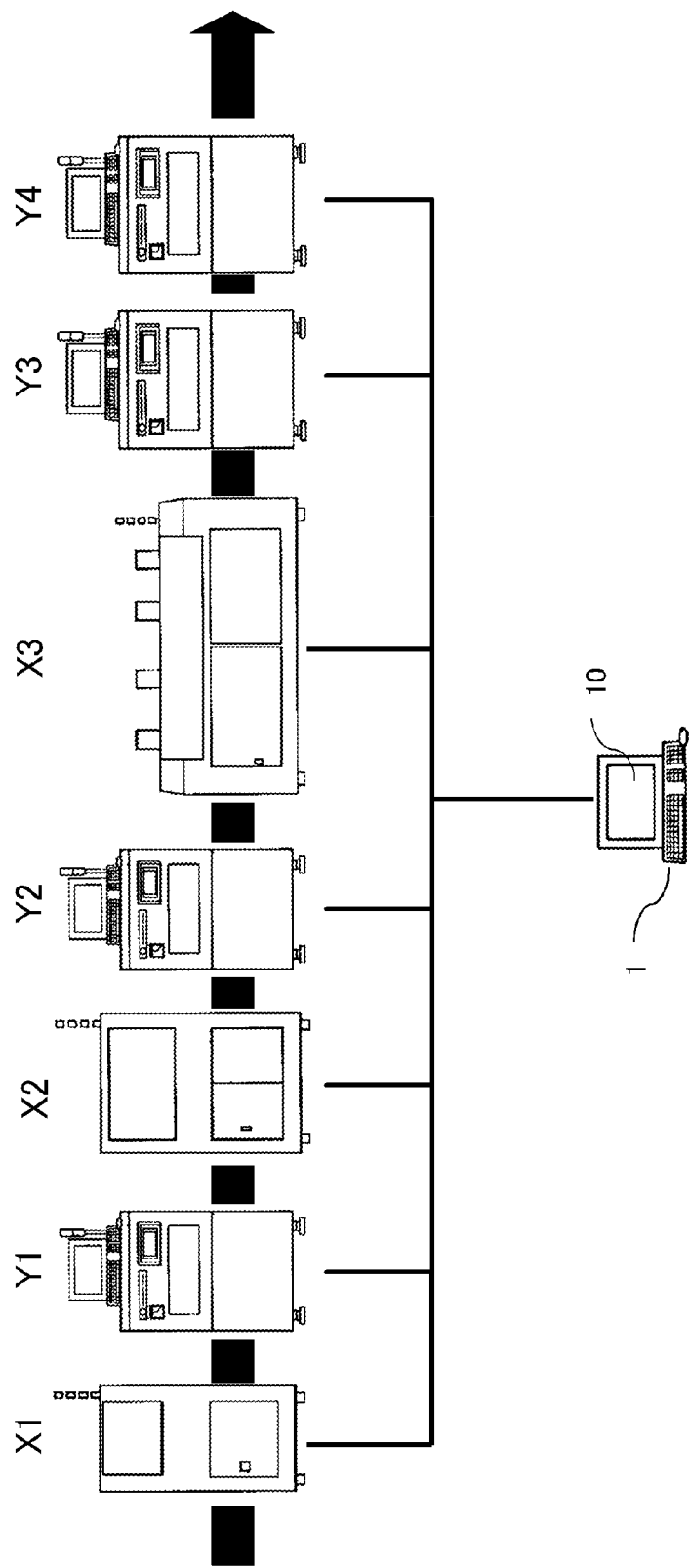
FIG. 4 is a view illustrating a schematic structure of a manufacturing facility according to an embodiment.

FIG. 4 schematically illustrates an example of the structure of a manufacturing facility in a surface mounting line for printed circuit boards, according to the embodiment. Surface Mount Technology (SMT) is a technology for soldering electronic components onto the surface of a printed circuit board, and the surface mounting line mainly includes three processes for printing of solder, mounting of components, and reflowing (welding of solder).

As illustrated in FIG. 4, in the surface mounting line, as manufacturing devices, there are provided a solder printing device X1, a mounter X2, and a reflow furnace X3 in the mentioned order from the upstream side. The solder printing device X1 is a device for printing paste-type solder at electrode portions (which are called lands) on a printed circuit board by screen printing. The mounter X2 is a device for picking up an electronic component to be mounted on the board and placing the electronic component on the solder paste at a corresponding position. The reflow furnace X3 is a heating device for heating and melting the solder paste and then cooling the solder paste, thereby solder-bonding the electronic component onto the board. When electronic components or types of electronic components to be mounted on the board is larger in number, a plurality of mounters X2 may be provided in the surface mounting line.

In the surface mounting line, there is installed a system for inspecting the state of the board and for automatically detecting defects or possibility of defects therein, at the exits of the respective processes for printing of solder, mounting of components, and reflowing. This system also has the function of providing feedback to the operations of the respective manufacturing devices (for example, changing the mounting program, and the like), on the basis of the result of inspection and the result of analysis thereof, in addition to the function of automatically sorting out defective products from non-defective products.

A solder printing inspection device Y1 is a device for inspecting the state of printing of the solder paste, for the board carried out from the solder printing device X1. The solder printing inspection device Y1 measures the solder paste printed on the board, in a two-dimensional or three-dimensional manner. Further, from the result of the measurement, the solder printing inspection device Y1 determines whether or not the solder paste has normal values (within allowable ranges) regarding various inspection items. Examples of the inspection items include the volume, the area, the height, the positional deviation, and the shape of the solder. An image sensor (a camera) or the like can be used for measuring the solder paste in a two-dimensional manner. A laser displacement gauge, a phase shift method, a space encoding method, a light cutting method or the like can be used for measuring it in a three-dimensional manner.

A component inspection device Y2 is a device for inspecting the state of placement of electronic components with respect to the board carried out from the mounter X2. The component inspection device Y2 measures components (which may be portions of components such as component bodies or electrodes) placed on the solder paste, in a two-dimensional or three-dimensional manner. Further, from the result of the measurement, the component inspection device Y2 determines whether or not the components have normal values (within allowable ranges) regarding various inspection items. For example, the inspection items include a positional deviation and an angular (rotational) deviation of a component, missing of a component (non-placement of a component), a difference of a component (a wrong component having been placed), a difference in polarity (a difference in electrode polarity between the component side and the board side), front and back reversal (a component having been placed upside down), a height of a component, and the like. Similarly to in the inspection of the solder printing, an image sensor (a camera) or the like can be used for measuring the electronic components in a two-dimensional manner. A laser displacement gauge, a phase shift method, a space encoding method, a light cutting method or the like can be used for measuring it in a three-dimensional manner.

An external-appearance inspection device Y3 is a device for inspecting the quality of the soldering, with respect to the board carried out from the reflow furnace X3. The external-appearance inspection device Y3 measures the soldered portions after the reflowing in a two-dimensional or three-dimensional manner. Further, from the result of the measurement, the external-appearance inspection device Y3 determines whether or not the soldered portions have normal values (within allowable ranges) regarding various inspection items. The inspection items include whether or not the solder fillet shape is good, in addition to the same items as those for the component inspection. For measuring the shape of the solder, it is possible to use a so-called color highlight method (a method which directs R, G, and B illumination to the solder surfaces at different incident angles and photographs reflected light of the respective colors with a zenith camera for detecting the three-dimensional shape of the solder as two-dimensional hue information), in addition to a laser displacement gauge, a phase shift method, a space encoding method, a light cutting method, and the like as described above.

An X-ray inspection device Y4 is a device for inspecting the state of the soldering of the board, using an X-ray image. For example, in cases of a multilayer board or a package component such as a ball grid array (BGA) or a chip size package (CSP), the solder-bonding portions are hidden under components or the board, which makes it impossible to inspect the state of soldering by the external-appearance inspection device Y3 (namely, by using an image of the external appearance). The X-ray inspection device Y4 is a device for compensating for this weak point of the external appearance inspection. Inspection items of the X-ray inspection device Y4 include, for example, a positional deviation of a component, a height of the solder, the volume of the solder, a solder ball diameter, a length of a back fillet, and whether or not the solder bonding is good. Incidentally, as an X-ray image, an X-ray transmission image can be used, and a computed tomography (CT) image can be also preferably used.

(Management Device)

The manufacturing devices X1 to X3 and the inspection devices Y1 to Y4 described above are connected to a management device 1 through a network (LAN). The management device 1 is a system for managing and controlling the manufacturing devices X1 to X3 and the inspection devices Y1 to Y4. Although not illustrated, the management device 1 is constituted by a general-purpose computer system including a CPU (a processor), a main storage device (a memory), an auxiliary storage device (a hard disk or the like), an input device (a keyboard, a mouse, a controller, a touch panel or the like), a display device 10, and the like. Functions of the management device 1, which will be described later, are realized by the CPU reading and executing programs stored in the auxiliary storage device.

Incidentally, the management device 1 may be constituted by either one computer or plural computers. Also, all or some of the functions of the management device 1 can be implemented in a computer incorporated in any of the manufacturing devices X1 to X3 and the inspection devices Y1 to Y4. Also, some of the functions of the management device 1 may be realized by a server (such as a cloud server) on a network.

Figure 5:
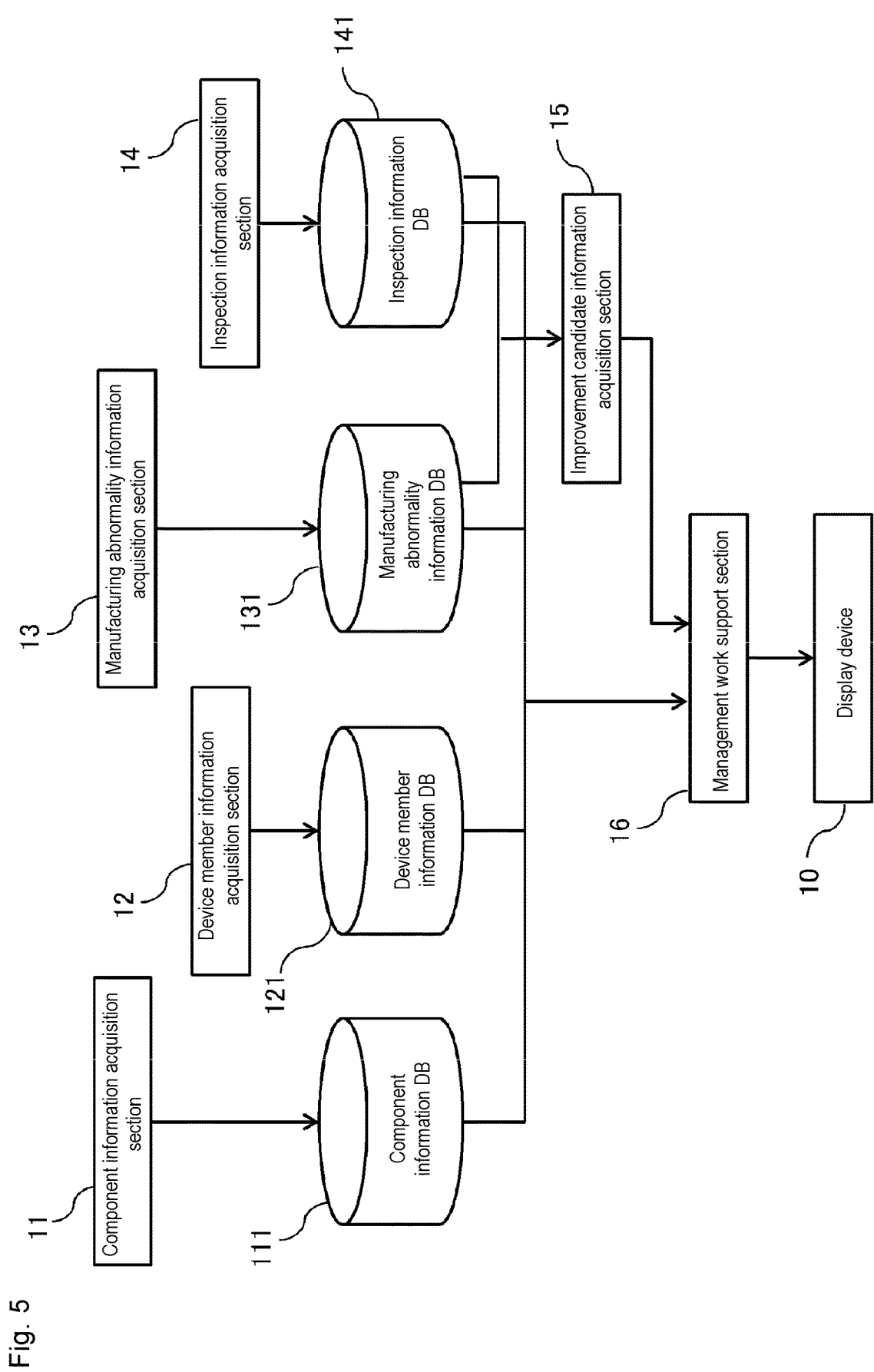
FIG. 5 is a functional block diagram of a management device according to the embodiment.

The management device 1 according to the embodiment includes functional units for realizing functions for enabling the manager of the manufacturing facility to efficiently perform maintenance and quality control of the manufacturing facility. FIG. 5 illustrates a block diagram of the functional units included in the management device 1.

As illustrated in FIG. 5, the management device 1 includes the functional units, which are a component information acquisition section 11, a component information database (DB) 111, a device member information acquisition section 12, a device member information DB 121, a manufacturing abnormality information acquisition section 13, a manufacturing abnormality information DB 131, an inspection information acquisition section 14, an inspection information DB 141, an improvement candidate information acquisition section 15, and a management work support section 16.

Hereinafter, the respective functional units in the management device 1 will be described regarding their operations, in detail, by exemplifying the mounter X2.

(Mounter)

Figure 6:
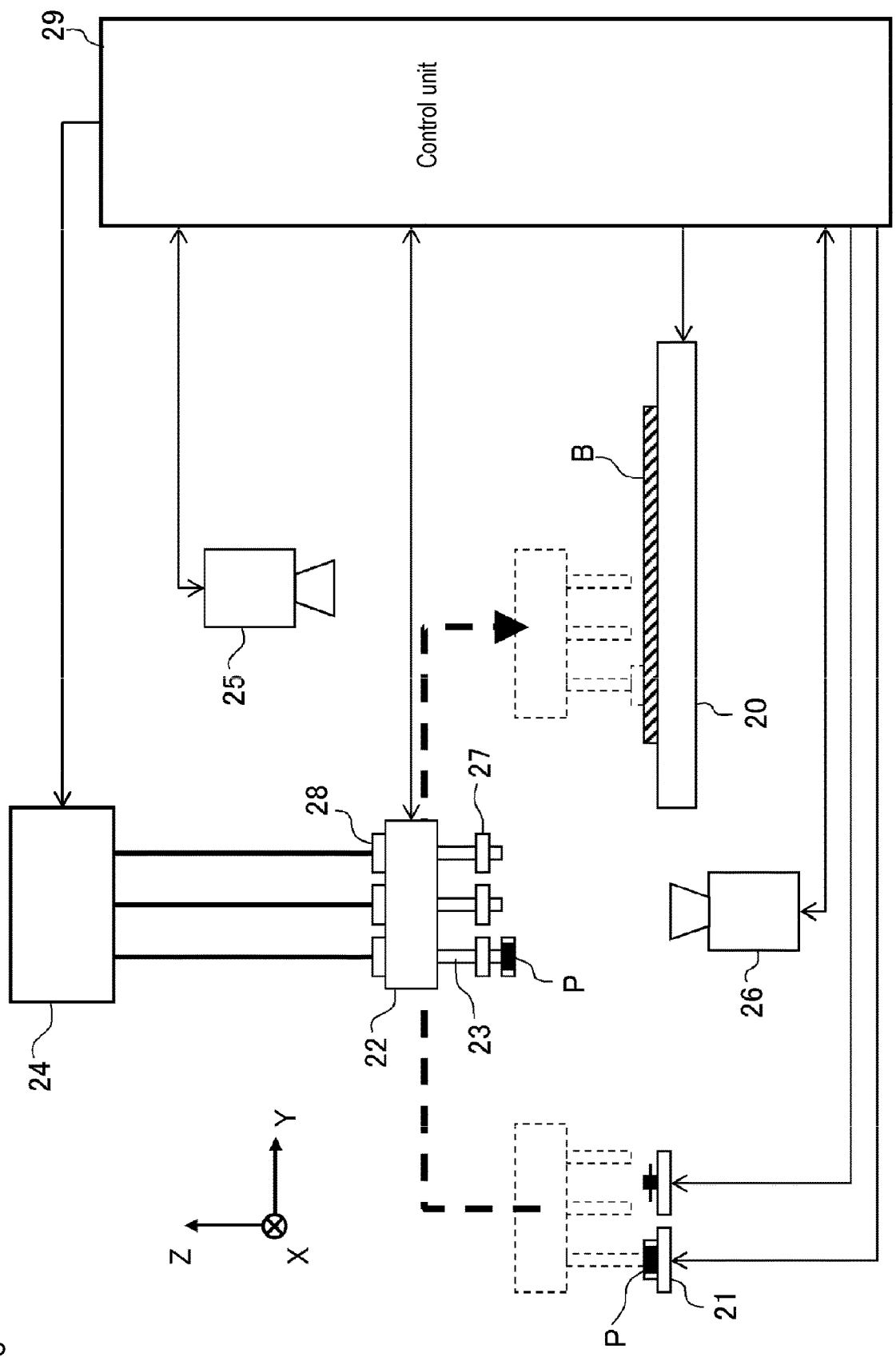
FIG. 6 is a schematic diagram illustrating the structure of a mounter according to the embodiment.

FIG. 6 is a diagram schematically illustrating the structure of the mounter X2. The mounter X2 includes a stage 20 for placing a board B thereon, a plurality of feeders 21 for supplying electronic components P, a movable head 22 for picking up the electronic components P, a plurality of nozzles 23 attached to the head 22, a vacuum pump 24 for controlling the air pressure of each nozzle, and the like. The electronic components P having different product numbers are set on the feeders 21 in the respective rows. In addition, the mounter X2 includes an upper camera 25, a lower camera 26, contact sensors 27 for measuring the contact pressures at the nozzle end surfaces, pressure sensors 28 for measuring the air pressures of the nozzles, and the like, as an observation system for detecting abnormalities of operations of the mounter X2 itself. A control unit 29 is a block for performing control, calculations, and information processing for the respective portions of the mounter X2, and includes a CPU (a processor), a memory, and the like. In addition, the control unit 29 may also include an output device for outputting information. In a coordinate system, an X axis and a Y axis are defined in parallel to the board surface, and a Z axis is defined perpendicularly to the board surface.

When the board B has been loaded onto the stage 20, the control unit 29 controls the respective nozzles 23 according to a mounting program, which causes the nozzles 23 to suck and convey necessary electronic components P from the feeders 21, and to sequentially place the electronic components P on the board B. When the placement (the mounting) of all the electronic components P has been completed, the board B is carried out to a downstream process (the inspection device Y2). Further, as information about the manufacturing of the board B, manufacturing log information is recorded in the memory in the mounter X2, and the manufacturing log information includes a board ID, the component numbers of the respective components, a circuit number, and manufacturing abnormality information associated with information (nozzle IDs, feeder IDs) about the device members which processed the respective components.

FIG. 7 is an example of manufacturing log information about the mounter X2. Each row shows a record of the manufacturing of one component, and includes information such as a board ID, a component number, a circuit number, a nozzle ID, a feeder ID, and manufacturing abnormality information (the number of image determination processing errors, the number of component non-suction errors), and the like. By referring to the manufacturing log information, it is possible to know which device members were used for manufacturing each component on the board.

(Data Collection by the Management Device)

The component information acquisition section 11 acquires information about components, such as various electronic components, boards, and solders which are used in the production lines. Further, the component information acquisition section 11 stores the information in the component information DB 111. The information can be acquired at arbitrary timing. For example, such information may be acquired when components are newly introduced into the production lines or when components having an existing component number but being in a different manufacturing lot are introduced into the production lines, and the like. As a method for acquiring such information, such information may be automatically acquired from a server of the component maker through a network, or may be acquired by being inputted by a user, for example.

The device member information acquisition section 12 acquires information about various members and mechanisms constituting the manufacturing devices such as the mounter X2, and stores the information in the device member information DB 121. The information can be acquired at arbitrary timing. For example, the information may be acquired when replacement, maintenance or the like of device members has been performed, when a new device member is introduced into the production lines, and the like. As a method for acquiring such information, such information may be automatically acquired from a server of the manufacturing device maker through a network, or may be acquired by being inputted by a user, for example.

The manufacturing abnormality information acquisition section 13 acquires the aforementioned manufacturing log information (manufacturing abnormality information included therein) from the mounter X2, and stores the manufacturing log information in the manufacturing abnormality information DB 131. The manufacturing log information can be acquired at arbitrary timing. For example, the control unit 29 in the mounter X2 may transmit the manufacturing log information to the management device 1 every time the mounting on a board has been completed in the mounter X2. Also, the manufacturing abnormality information acquisition section 13 may acquire such information at a predetermined time or frequency, or may acquire such information in response to an acquisition request from the user.

The inspection information acquisition section 14 acquires information about the result of inspection of the board after mounting (in particular, information about actual defects and overlooking), from the component inspection device Y2. Further, the inspection information acquisition section 14 stores this information in the inspection information DB 141. Such inspection information can be acquired at arbitrary timing. For example, such inspection information may be acquired every time the inspection of the board has been completed in the component inspection device Y2. Also, such information may be acquired at a predetermined time or frequency, or may be acquired in response to an acquisition request from the user.

The improvement candidate information acquisition section 15 extracts a device member or component number which is estimated to be a cause of an error during manufacturing of a component or a defect during inspection (namely, which is a candidate for improvement), based on the information acquired by the manufacturing abnormality information acquisition section 13 and the inspection information acquisition section 14. The timing and method of acquiring such improvement candidate information are not particularly limited. However, for example, a candidate for improvement may be extracted for every predetermined aggregation time period, based on a comparison of the number of occurrences of abnormalities regarding each device member or component number with a normal value, a comparison in number of occurrences of abnormalities among different members or component numbers of the same type, and the like.

The management work support section 16 creates list information including the aggregated values of abnormalities of respective sorts during manufacturing and abnormalities of respective sorts during inspections, within a predetermined aggregation time period, for the respective device members and component numbers as the candidates for improvement, based on the information acquired by the component information acquisition section 11, the device member information acquisition section 12, the manufacturing abnormality information acquisition section 13, the inspection information acquisition section 14, and the improvement candidate information acquisition section 15. Further, the management work support section 16 outputs this list information to the display device 10. Incidentally, the display device 10 to which the list information is outputted may be structured separately from the main body of the management device 1. Namely, the list information may be outputted thereto through a communication unit (not illustrated).

The display device 10 may display, thereon, a screen similar to the screen (see FIG. 3) outputted in the manufacturing facility management system 9 according to the aforementioned example of application. However, the screen displayed on the display device 10 is not limited thereto. FIG. 8 illustrates an example of a screen displayed on the display device.

As illustrated in FIG. 8, in the another example of the screen displayed thereon, device members and components are collectively displayed as candidates for improvement (hereinafter, device members and components will be also collectively referred to as devices). Further, there are displayed, as numerical values, the aggregated values of abnormalities of respective sorts regarding respective devices as the candidates for improvement. Further, these aggregated values are displayed by horizontal bar graphs. The respective devices are displayed in descending order of number of actual defects. This allows the facility manager to grasp the situation of occurrences of abnormalities, more intuitively.

Further, the manager can narrow down the events which have caused the abnormalities, based on the displayed list information, according to a method as follows, for example.

Example 1 of Event which has Caused an Abnormality

For example, in a case where the type of a device extracted as an object to be improved is "nozzle", and actual defects as abnormalities have been counted, the following three events are considered to be causes of the occurrence of these actual defects. Namely, the cause of the occurrence of these actual defects is one of an event that "the nozzle moves slowly in the upward and downward directions, and the nozzle sucks and mounts the component at unsuitable heights, which induces suction mistakes or component deviations at the time of mounting", an event that "the nozzle is not suitable for the component shape and is prevented from stably sucking the component, which has induced component deviations during movement of the head after the suction of the component", and an event that "the nozzle is clogged and can not stably suck the component due to shortage of the vacuum pressure, which has induced component deviations during movement of the head after the suction of the component".

FIG. 9A is a table illustrating the relationship between the causes of occurrences of actual defects in a nozzle, and the presence or absence of an image determination processing error and a component non-suction error, which are abnormalities regarding this nozzle during manufacturing. Here, in a case where not only actual defects but also component non-suction errors have been counted regarding the nozzle extracted as an object to be improved, as illustrated in FIG. 9A, it is possible to narrow down the cause of occurrences of the actual defects to the event #1 where "the nozzle moves slowly in the upward and downward directions, and the nozzle sucks and mounts the component at unsuitable heights, which induces suction mistakes or component deviations at the time of mounting". In this case, the manager may instruct an operator to check whether the nozzle moves smoothly.

On the other hand, in a case where an actual defect has occurred, but none of an image determination processing error and a component non-suction error has occurred, the cause of the actual defect is the event #2 where "the nozzle is not suitable for the component shape and is prevented from stably sucking the component, which has induced component deviations during movement of the head after the suction of the component", or the event #3 where "the nozzle is clogged and can not stably suck the component due to shortage of the vacuum pressure, which has induced component deviations during movement of the head after the suction of the component". For coping therewith, as an action for improvement, the manager instructs an operator to check clogging of the nozzle and confirms a mounting program (parameters) for components.

Example 2 of Event which has Caused an Abnormality

Next, in a case where the type of a device to be improved is "component number", no actual defect has occurred, and an image determination processing error has occurred, the following four events are considered to be causes of this image determination processing error. Namely, the cause of this image determination processing error is one of an event that "the actual size of the component has changed depending on lot properties", an event that "the position of the component has been inaccurately detected", an event that "the allowable range (tolerance) for the component size is too severe", and an event that "the position at which the component is sucked has been greatly deviated".

FIG. 9B is a table illustrating the relationship between the causes of occurrence of an image determination processing error regarding a component number, and the presence or absence of an actual defect and a component non-suction error, regarding this component number. Here, in a case where no abnormality other than an image determination processing error has been counted for the component number extracted as an object to be improved, as illustrated in FIG. 9B, the cause of the occurrence thereof is the event #1 that "the actual size of the component has changed depending on lot properties" or the event #3 that "the allowable range (tolerance) for the component size is too severe".

Advantages of the Embodiment

The structure according to the aforementioned embodiment is adapted to display list information including the aggregated values of abnormalities of respective sorts during manufacturing boards and abnormalities of respective sorts during inspection, for respective devices to be improved, which enables a facility manager to easily narrow down the causes of abnormalities as described above and to efficiently perform maintenance and quality control of the manufacturing facility.

<Others>

The description of the aforementioned embodiment is merely illustrative description of the present invention, and the present invention is not limited to the aforementioned specific modes. Various modifications can be made thereto within the scope of the technical concept of the present invention. For example, in the aforementioned embodiment, the list information created by the management work support section 16 may include the date and time of latest replacement of a device to be improved, the elapsed time period since the latest replacement thereof, the history of the number of times of replacement thereof, and the like. Further, the list information may also include information such as the date and time of latest maintenance of a device member as a device to be improved, the cumulative number of times maintenance thereof has been performed, and the like.

Furthermore, in the aforementioned embodiment, the devices to be improved are sorted with emphasis on the number of occurrences of actual defects. However, it is not necessary to display the devices to be improved in such order, and the devices to be improved may be also displayed in descending order of possibility of causing abnormalities, based on information about other abnormalities, and the like.

Further, In the aforementioned embodiment, the management work support section is structured to cause the display device to output a screen including the list information. However, the present invention is not limited to this structure, and the management work support section may only create data for displaying a screen which includes the list information. The created data may be transmitted to another apparatus through a communication unit or may be stored in a storage section. Namely, the present invention is also applicable to an information processing device including no display unit.

Further, the management device 1 according to the aforementioned embodiment may also include a notification unit as follows. Namely, when an abnormality has been detected in the manufacturing lines, and a device to be improved has been extracted as a cause of this abnormality, this notification unit notifies the manager of this fact.

Further, although the aforementioned embodiment has been described by exemplifying a chip mounter in a manufacturing line for component-mounted boards, the present invention is also applicable to manufacturing facilities for other products.

<Supplementary Note>

According to one embodiment of the present invention, there is provided a management system (1) for a manufacturing facility including a manufacturing device including one or more device members for manufacturing a product, and an inspection device configured to inspect the product, the system including:
- a display unit (10),
- a device member information acquisition unit (12) configured to acquire device member information about each device member in the manufacturing device;
- a product member information acquisition unit (11) configured to acquire product member information about each product member constituting the product;
- a manufacturing abnormality information acquisition unit (13) configured to acquire manufacturing abnormality information about an abnormality during manufacturing of the product in the manufacturing device;
- an inspection information acquisition unit (14) configured to acquire inspection information including information about an abnormality during inspection of the product by the inspection device;
- an improvement candidate information acquisition unit (15) configured to acquire improvement candidate information which is information about the device member and/or the product member as a candidate for improvement in the manufacturing facility; and
- a management work support unit (16) configured to create list information based on the device member information, the product member information, the manufacturing abnormality information, the inspection information, and the improvement candidate information, and configured to cause the display unit to display the list information, the list information including an aggregated value of abnormalities of each sort during manufacturing the product and an aggregated value of abnormalities of each sort during inspecting the product within a predetermined aggregation time period, for each device member and/or product member as the candidate for improvement.

Further, according to another embodiment of the present invention, there is provided a management device (1) for a manufacturing facility including a manufacturing device including one or more device members for manufacturing a product, and an inspection device for inspecting the product, the device including:
- a device member information acquisition unit (12) for acquiring device member information about each device member in the manufacturing device;
- a product member information acquisition unit (11) for acquiring product component information about each product component constituting the product;
- a manufacturing abnormality information acquisition unit (13) for acquiring manufacturing abnormality information about an abnormality during manufacturing of the product in the manufacturing device;
- an inspection information acquisition unit (14) for acquiring inspection information including information about an abnormality during inspection of the product by the inspection device;
- an improvement candidate information acquisition unit (15) for acquiring improvement candidate information which is information about the device member and/or the product member as a candidate for improvement in the manufacturing facility; and
- a management work support unit (16) for creating list information including an aggregated value of abnormalities of each sort during manufacturing the product and an aggregated value of abnormalities of each sort during inspecting the product within a predetermined aggregation time period, for each device member and/or or product member as the candidate for improvement, based on the device member information, the product member information, the manufacturing abnormality information, the inspection information, and the improvement candidate information.

Further, according to another embodiment of the present invention, there is provided a method for managing a manufacturing facility including a manufacturing device including one or more device members for manufacturing a product, and an inspection device configured to inspect the product, the method including:
- a device member information acquisition step (S102) of acquiring device member information about each device member in the manufacturing device;
- a product component information acquisition step (S101) of acquiring product member information about each product member constituting the product;
- a manufacturing abnormality information acquisition step (S103) of acquiring manufacturing abnormality information about an abnormality during manufacturing of the product in the manufacturing device;
- an inspection information acquisition step (S104) of acquiring inspection information including information about an abnormality during inspection of the product by the inspection device;
- an improvement candidate information acquisition step (S105) of acquiring improvement candidate information which is information about the device member and/or the product member as a candidate for improvement in the manufacturing facility;
- a management work support information creation step (S106) of creating list information including an aggregated value of abnormalities of each sort during manufacturing the product and an aggregated value of abnormalities of each sort during inspecting the product within a predetermined aggregation time period, for each device member and/or product member as the candidate for the improvement, based on the device member information, the product member information, the manufacturing abnormality information, the inspection information, and the improvement candidate information; and
- a management work support information output step (S107) of outputting the list information created in the management work support information creation step.

DESCRIPTION OF SYMBOLS

1 management device
10 display device
11 component information acquisition section
111 component information DB
12 device member information acquisition section
121 device member information DB
13 manufacturing abnormality information acquisition section
131 manufacturing abnormality information DB
14 inspection information acquisition section
141 inspection information DB
15 improvement candidate information acquisition section
16 management work support section
20 stage
21 feeder
22 head
23 nozzle
24 vacuum pump 25 upper camera
26 lower camera
27 contact sensor
28 pressure sensor
29 control unit
X1 solder printing device
X2 mounter
X3 reflow furnace
Y1 solder printing inspection device
Y2 component inspection device
Y3 external-appearance inspection device
Y4 X-ray inspection device
B board
P electronic component

The invention claimed is:

1. A management system for a manufacturing facility including a manufacturing device including one or more device members for manufacturing a product, and an inspection device configured to inspect the product, the system comprising:
 a display unit; and
 a processor configured to execute computer-executable instructions stored in a memory to:
 acquire device member information about each device member in the manufacturing device;
 acquire product member information about each product member constituting the product;
 acquire manufacturing abnormality information about an abnormality during manufacturing of the product in the manufacturing device;
 acquire inspection information including information about an abnormality during inspection of the product by the inspection device;
 acquire improvement candidate information which is information about the device member and/or the product member as a candidate for improvement in the manufacturing facility; and
 create list information based on the device member information, the product member information, the manufacturing abnormality information, the inspection information, and the improvement candidate information, and cause the display unit to display the list information, the list information including an aggregated value of abnormalities of each sort during manufacturing the product and an aggregated value of abnormalities of each sort during inspecting the product within a predetermined aggregation time period, for each device member and/or product member as the candidate for improvement.

2. The management system according to claim 1, wherein the list information further includes information indicating a position at which an abnormality has occurred.

3. The management system according to claim 1, wherein the list information further includes information about replacement of the device member, and information about maintenance of the device member.

4. The management system according to claim 1, wherein the processor is configured to execute the computer-executable instructions stored in the memory to display the device members and/or the product members as the candidates for improvement, in descending order of number of abnormalities during manufacturing the product and/or abnormalities during inspection of the product, or in descending order of possibility of causing an abnormality during manufacturing the product and/or an abnormality during inspecting the product.

5. The management system according to claim 1, wherein the processor is configured to execute the computer-executable instructions stored in the memory to display, in different colors, the respective sorts of abnormalities during manufacturing the product and abnormalities during inspecting the product, in such a manner as to change a density of the colors according to numerical values of the aggregated values of the abnormalities.

6. The management system according to claim 1, wherein the candidate for improvement in the improvement candidate information is constituted by only the device member and/or the product member regarding which a cause of an abnormality during manufacturing the product and/or an abnormality during inspection of the product has been identified.

7. The management system according to claim 1, wherein the product is a component mounted board, the manufacturing device is a chip mounter, and the product member is a component,
 abnormalities during manufacturing the product include at least one of a component non-suction defect during mounting the component, and a defect of image determination processing during mounting the component, and
 abnormalities during inspecting the product include at least any one of an actual defect of the component mounted board, over detection, and an abnormality of a measurement value.

8. A management device for a manufacturing facility including a manufacturing device including one or more device members for manufacturing a product, and an inspection device configured to inspect the product, the device comprising:
 a memory configured to store computer-executable instructions; and
 a processor configured to execute the computer-executable instructions stored in the memory to:
 acquire device member information about each device member in the manufacturing device;
 acquire product member information about each product member constituting the product;
 acquire manufacturing abnormality information about an abnormality during manufacturing of the product in the manufacturing device;
 acquire inspection information including information about an abnormality during inspection of the product by the inspection device;
 acquire improvement candidate information which is information about the device member and/or the product member as a candidate for improvement in the manufacturing facility; and
 create list information including an aggregated value of abnormalities of each sort during manufacturing the product and an aggregated value of abnormalities of each sort during inspecting the product, within a predetermined aggregation time period, for each device member and/or product member as the candidate for improvement, based on the device member information, the product member information, the manufacturing abnormality information, the inspection information, and the improvement candidate information and display the created list information.

9. A method for managing a manufacturing facility including a manufacturing device including one or more device members for manufacturing a product, and an inspection device configured to inspect the product, the method comprising:

a device member information acquisition step of acquiring device member information about each device member in the manufacturing device;

a product member information acquisition step of acquiring product member information about each product member constituting the product;

a manufacturing abnormality information acquisition step of acquiring manufacturing abnormality information about an abnormality during manufacturing of the product in the manufacturing device;

an inspection information acquisition step of acquiring inspection information including information about an abnormality during inspection of the product by the inspection device;

an improvement candidate information acquisition step of acquiring improvement candidate information which is information about the device member and/or the product member as a candidate for improvement in the manufacturing facility;

a management work support information creation step of creating list information including an aggregated value of abnormalities of each sort during manufacturing the product and an aggregated value of abnormalities of each sort during inspecting the product, within a predetermined aggregation time period, for each device member and/or product member as the candidate for the improvement, based on the device member information, the product member information, the manufacturing abnormality information, the inspection information, and the improvement candidate information; and a management work support information output step of outputting the list information created in the management work support information creation step.

10. A non-transitory computer readable medium storing program configured to cause an information processing device to execute the respective steps in the managing method according to claim 9.

\* \* \* \* \*